United States Patent
Heismann et al.

(10) Patent No.: US 10,509,083 B2
(45) Date of Patent: Dec. 17, 2019

(54) MAGNETIC RESONANCE TOMOGRAPHY UNIT WITH TRANSMITTING UNIT AND SELECTOR AND METHOD FOR OPERATION

(71) Applicants: Björn Heismann, Erlangen (DE); Markus Vester, Nürnberg (DE)

(72) Inventors: Björn Heismann, Erlangen (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 133 days.

(21) Appl. No.: 15/659,233

(22) Filed: Jul. 25, 2017

(65) Prior Publication Data
US 2018/0024206 A1     Jan. 25, 2018

(30) Foreign Application Priority Data
Jul. 25, 2016 (DE) .................. 10 2016 213 579

(51) Int. Cl.
| | | |
|---|---|---|
| *G01R 33/28* | (2006.01) | |
| *G01R 33/30* | (2006.01) | |
| *G01R 33/36* | (2006.01) | |
| *G01R 33/34* | (2006.01) | |
| *G01R 33/3415* | (2006.01) | |

(52) U.S. Cl.
CPC ......... *G01R 33/288* (2013.01); *G01R 33/307* (2013.01); *G01R 33/34007* (2013.01); *G01R 33/3607* (2013.01); *G01R 33/3664* (2013.01); *G01R 33/283* (2013.01); *G01R 33/3415* (2013.01)

(58) Field of Classification Search
CPC .............. G01R 33/288; G01R 33/3664; G01R 33/34007; G01R 33/307; G01R 33/3607; G01R 33/3415; G01R 33/283
See application file for complete search history.

(56) References Cited

U.S. PATENT DOCUMENTS

| | | | | |
|---|---|---|---|---|
| 4,975,644 A | * | 12/1990 | Fox ..................... | G01R 33/3415 324/318 |
| 6,223,065 B1 | * | 4/2001 | Misic .................. | G01R 33/3415 324/318 |
| 7,535,230 B2 | * | 5/2009 | Takagi ............... | G01R 33/3415 324/318 |

(Continued)

FOREIGN PATENT DOCUMENTS

| | | |
|---|---|---|
| DE | 102009003862 A1 | 11/2009 |
| DE | 102014213722 A1 | 1/2016 |

OTHER PUBLICATIONS

German Office Action for German Application No. 10 206 213 579.1, dated Mar. 23, 2017, with English Translation.

*Primary Examiner* — G. M. A Hyder
(74) *Attorney, Agent, or Firm* — Lempia Summerfield Katz LLC

(57) ABSTRACT

A magnetic resonance tomography unit includes a control unit, a transmitting unit having one or a plurality of transmitting antennae, a selector, and a high-frequency unit having a signal output in signal connection with the transmitting unit. The transmitting unit is configured to irradiate high-frequency energy using the selector and the one or plurality of transmitting antennae optionally into only a first region of a plurality of different regions in a patient.

9 Claims, 3 Drawing Sheets

(56) References Cited

U.S. PATENT DOCUMENTS

| | | | |
|---|---|---|---|
| 7,782,057 B2* | 8/2010 | Okamoto | G01R 33/365 324/318 |
| 7,915,892 B2* | 3/2011 | Okamoto | G01R 33/34046 324/318 |
| 2005/0134270 A1* | 6/2005 | Dumoulin | G01R 33/3415 324/318 |
| 2009/0273346 A1* | 11/2009 | Zhu | G01R 33/288 324/314 |
| 2017/0016971 A1 | 1/2017 | Heismann | |

* cited by examiner

MAGNETIC RESONANCE TOMOGRAPHY UNIT WITH TRANSMITTING UNIT AND SELECTOR AND METHOD FOR OPERATION

This application claims the benefit of DE 10 2016 213 579.1, filed on Jul. 25, 2016, which is hereby incorporated by reference in its entirety.

BACKGROUND

The present embodiments relate to a magnetic resonance tomography unit and to a method for operating the magnetic resonance tomography unit.

Magnetic resonance scanners are imaging devices that, for mapping an examination object, orient nuclear spins of the examination object using a strong external magnetic field and excite the nuclear spins to precession around this orientation via a magnetic alternating field. The precession or return of the spins from this excited state into a state with lower energy generates a magnetic alternating field (e.g., a magnetic resonance signal) as a response, which is received by antennae.

With the aid of magnetic gradient fields, a spatial encoding is impressed on the signals, and this subsequently enables allocation of the received signal to a volume element. The received signal is then evaluated, and a three-dimensional imaging representation of the examination object is supplied.

Magnetic alternating fields having a frequency corresponding to the Larmor frequency at the respective static magnetic field strength, and very high field strengths or outputs are provided for excitation of the precession of the spins. Antennae (e.g., local coils) that are arranged directly on the patient are used to improve the signal-to-noise ratio of the magnetic resonance signal received by the antennae.

From DE 102014213722, a magnetic resonance tomography unit that, for excitation of the spins in a plurality of regions of an examination object, has a transmitting unit with a plurality of segments, via which different high-frequency pulses having different frequencies are simultaneously emitted in each case to enable simultaneous image acquisition in a plurality of slices, is known.

The high-frequency pulses used for excitation have a power in the region of a few hundred watts to kilowatts to improve a signal-to-noise ratio (SNR). Legal limit values, which are denoted as the specific absorption rate (SAR), are defined to protect a patient from injury due to the effect of the heat of the high-frequency pulses. The speed of imaging using a magnetic resonance tomography unit is also limited by these limit values, which limit the energy absorption per unit of time and thereby the high-frequency power.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance tomography unit that enables faster image acquisition while observing the limit values is provided.

The magnetic resonance tomography unit of one or more of the present embodiments has a control unit, a high-frequency unit, a transmitting unit having one or a plurality of transmitting antennae, and a selector. Within the scope of the present embodiments, a selector may be a unit that allows selection of a region to be excited by the transmitting unit. Different embodiments of the selector are disclosed below. The magnetic resonance tomography unit has a high-frequency unit having a signal output in signal connection with the transmitting unit.

The magnetic resonance tomography unit is configured to irradiate high-frequency energy by the high-frequency unit, the selector, and the one or plurality of transmitting antennae optionally into only a first region of a plurality of connected different regions in a patient. "Irradiate" may denote if the high-frequency power density is to exceed a threshold value that, for example, exceeds more than 10, 20, or 50 percent of a maximum irradiated power density. Different regions may, for example, be regarded as regions that are not identical and instead differ in a large part of volume, so the intersection of two regions is less than half, 20%, or 10% of the volume of a region, or the two regions are even disjunct.

The restriction to a limited region may make it possible for the power budget admissible under the SAR limit values to be combined and for a better SNR and shorter examination times to be attained in this way.

The method of one or more of the present embodiments is a method for operating a magnetic resonance tomography unit that has a control unit, a transmitting unit having one or a plurality of transmitting antennae and a selector, and a high-frequency unit having a signal output in signal connection with the transmitting unit.

In one act of the method, a control unit detects a position of a patient relative to the transmitting unit. For example, position detectors such as a camera, a scanner, or the like may detect the position of a patient on an examination table and thereby also relative to a transmitting unit that is arranged, for example, in the examination table. A fast imaging magnetic resonance scan may also be provided for detection. In one embodiment, the control unit may detect the position via a user input at a user interface.

In a further act, the control unit detects a region to be examined. For example, an input by a user or data transfer may be provided.

In a further act of the method, the control unit determines a setting of the selector, which is provided for excitation of spins in the region to be examined by one or more transmitting unit(s). For example, the control unit may determine, via the known position of the patient and knowledge of the region to be examined (e.g., an organ or region of the body), which setting of the selector is to be provided in order to irradiate high frequency into this region of the body, for example. Individual embodiments for this purpose are disclosed in the following. The control unit induces a corresponding setting in the selector.

In a further act of the method, the high-frequency unit sends a high-frequency pulse for excitation of the spins in the region to be examined via the signal connection to a transmitting unit (e.g., in that the control unit instructs a high-frequency generator in the high-frequency unit to generate a high-frequency pulse, and the high-frequency pulse is amplified by a high-frequency power amplifier of the high-frequency unit). The setting of the selector provides that the high-frequency pulse is irradiated into the region to be examined.

The method shares the advantages of the magnetic resonance tomography unit.

In one embodiment of the magnetic resonance tomography unit, the selector of the transmitting unit has a positioning device. For example, the positioning device may be a single-axle bar or a cross bar. The positioning device is configured to position the transmitting element(s) in the transmitting unit in predetermined different relative positions. In one embodiment, the crossbar may position the transmitting antenna or a plurality of transmitting antennae at a predeterminable position using a step motor or a spindle motor with a position sensor.

The selector may move one or more transmitting antenna (e) in relative positions using the positioning device, so the one or more transmitting antenna(e) are positioned in the immediate vicinity of predetermined examination regions and selectively irradiate the high frequency into these regions. The number of transmitting antennae may be reduced, and the electronic control devices may be simplified in this way.

In one embodiment of the magnetic resonance tomography unit, the transmitting unit has a plurality of transmitting antennae and the selector has a switching matrix. The switching matrix is configured to bring a signal output of the high-frequency unit into signal connection with a non-empty subset of the plurality of transmitting antennae, so a single connected examination region of the examination object is excited. The subset is a genuine subset (e.g., the number of transmitting antennae in the subset is smaller than the number of transmitting antennae in the transmitting unit).

In other words, the switching matrix is configured to distribute a high-frequency signal at an input among one output or a group of outputs that are, for example, in signal connection with one or more transmitting antennae in each case. The control unit may control the switching matrix or switch the switching matrix into different configurations, so the high-frequency signal may be output at different outputs in a controlled manner. In the simplest case, the switching matrix may be a 1:n high-frequency switch. In one embodiment, the high-frequency unit may have two or more high-frequency amplifiers that are connected to the switching matrix, and this, for example, would constitute a 2:n switching matrix. In one embodiment, the outputs may be switched in groups, so the high-frequency signal is in each case simultaneously switched on a plurality of transmitting antennae (e.g., if rows of an n×m transmitting antenna matrix of the transmitting unit are to be chosen in order to excite an examination region).

The magnetic resonance tomography unit having the switching matrix of the selector enables fast and flexible excitation of a selectable examination region with a minimum of high-frequency power amplifiers.

In one embodiment of the magnetic resonance tomography unit, the control unit is configured to set the switching matrix as a function of a region of the patient to be examined such that the first region essentially only includes the region to be examined. In other words, the control unit is configured to determine and set a setting or configuration of the switching matrix by which high-frequency signals of the high-frequency unit are forwarded to one or more selected transmitting antennae. Essentially only the region to be examined is thus excited. "Essentially" may be that an excited region includes the region to be examined and only a volume that has at most 20%, 50% or 100% of the volume of the volume to be examined.

The control unit of the magnetic resonance tomography unit is capable of independently adjusting the settings of the selector to the region to be examined.

In one embodiment of the magnetic resonance tomography unit, the control unit is configured to maximize a transmitting power of the high-frequency unit as a function of the first region. One of the parameters when determining the transmitting power may be an SAR limit value for the first region. For example, the control unit may determine and set the transmitting power such that a measured or simulated SAR exposure just reaches the admissible limit value.

As the excitation is limited to the first region, the power density in this region may be maximized up to an admissible limit value, and therefore, the length of the examination is reduced, or the imaging is optimized due to the improved SNR.

DETAILED DESCRIPTION

Figure 1:
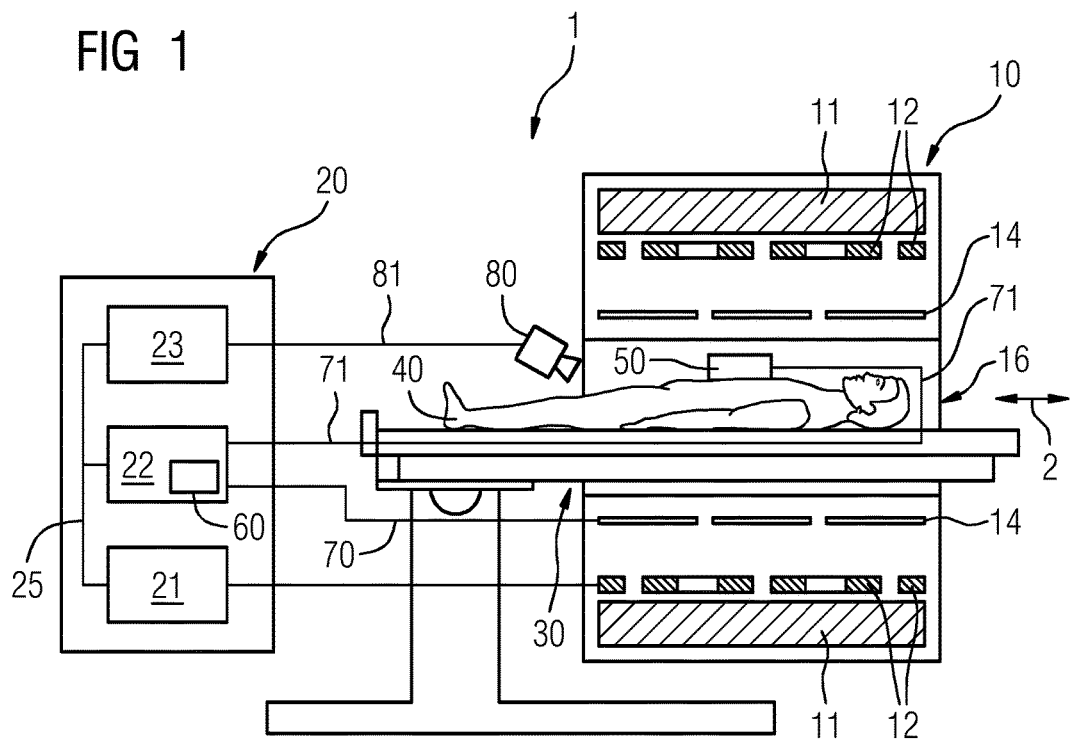
FIG. 1 shows one embodiment of a magnetic resonance tomography unit.

FIG. 1 shows a schematic diagram of an embodiment of a magnetic resonance tomography unit 1.

A magnetic unit 10 has a field magnet 11 that generates a static magnetic field BO for orientation of nuclear spins of samples or in a body of a patient 40 in a recording region. The recording region is arranged in a patient tunnel 16 that extends through the magnetic unit 10 in a longitudinal direction 2. The field magnet 11 is conventionally a superconducting magnet that may provide magnetic fields with a magnetic flux density of up to 3 T or more. Permanent magnets or electromagnets having normal-conducting coils may also be used for lower field strengths, however.

The magnetic unit 10 also has gradient coils 12 that, for spatial differentiation of the acquired imaging regions in the examination volume, are configured to overlay the magnetic field BO with variable magnetic fields in three spatial directions. The gradient coils 12 are conventionally coils including normal-conducting wires that may generate fields in the examination volume that are orthogonal to each other.

The magnetic unit 10 also has a body coil 14 that is configured to irradiate a high-frequency signal supplied via a signal connection 70 into the examination volume and, depending on the embodiment, also receive resonance signals emitted by the patient 40 and emit the received resonance signals via the signal connection 70. The magnetic resonance tomography unit 1 of one or more of the present embodiments also has one or more local coils 50 that are arranged in the patient tunnel 16 close to the patient 40.

A control unit 20 (e.g., a controller) supplies the magnetic unit 10 with the various signals for the gradient coils 12 and the body coil 14 and evaluates the received signals.

The control unit 20 therefore has a gradient controller 21 configured to supply the gradient coils 12 with variable currents via supply lines. The variable currents provide the desired gradient fields in the examination volume in a temporally coordinated manner.

The control unit 20 also has a high-frequency unit 22 configured to generate a high frequency pulse having a predefined time characteristic, amplitude, and spectral power distribution for excitation of a magnetic resonance of the nuclear spins in the patient 40. Pulse powers in the region of kilowatts may be achieved in the process. The individual units are connected to each other by a signal bus 25.

In the embodiment of the magnetic resonance tomography unit 1 illustrated in FIG. 1, the high-frequency unit 22 has a selector 60 that may be configured, for example, as a switching matrix, as is illustrated below in FIG. 6. A high-frequency power amplifier of the high-frequency unit 22 supplies an input of the selector 60 with a high-frequency signal for excitation of the spins, and, controlled by the controller 23 via the signal bus 25, the selector 60 may output the signal at one of a plurality of signal outputs that are connected via the signal connection 70 to three transmitting antennae of the transmitting unit (e.g., the segments of the body coil 14 arranged one behind the other in the longitudinal direction 2). In this way, the controller 23 may select via the selector 60 which transmitting antenna of the transmitting unit (e.g., which segment of the body coil 14) is controlled with the high-frequency signal and thereby in which region of the patient 40 spins are excited for imaging.

The local coil 50 may then receive a magnetic resonance signal from the body of the patient 40, because owing to the small spacing, the signal-to-noise ratio (SNR) of the local coil 50 is better than in the case of receiving through the body coil 14. The MR signal received by the local coil 50 is prepared in the local coil 50 and forwarded to the high-frequency unit 22 of the magnetic resonance tomography unit 1 for evaluation and image acquisition. The signal connection 71 may be used for this purpose, although separate signal connections or wireless transmission may also be provided.

In one embodiment, the local coil 50 may be provided as a local coil array having a plurality of coils that are also provided only for transmitting high-frequency coils for excitation of spins. In this case, the local coil 50 serves as a transmitting unit (e.g., a transmitter). This is customary, for example, with magnetic resonance tomography units that are used in the high-field range above 3 tesla. The selector 60 is then connected via the signal connection 70 to the local coils 50 and may output the high-frequency signal to individual or selected groups of transmitting coils. In this way, the high-frequency exposure may be concentrated on an even smaller volume and may be reduced for the entire body of the patient 40.

One embodiment of the magnetic resonance tomography unit 1 may also have a position detector (e.g., a camera 80) that is in signal connection 81 with the controller 23. The controller 23 is configured to detect a position of the patient 40 relative to the transmitting unit (e.g., in FIG. 1, the body coil 14), so the controller is capable of setting the selector 60 as a function of the relative position of the patient 40 and the desired examination region such that spins are excited in the desired examination region and the SAR exposure is reduced for the entire body. Conversely, the controller 23 may then also be configured to locally increase the transmitting power without exceeding an overall body limit value.

Figure 2:
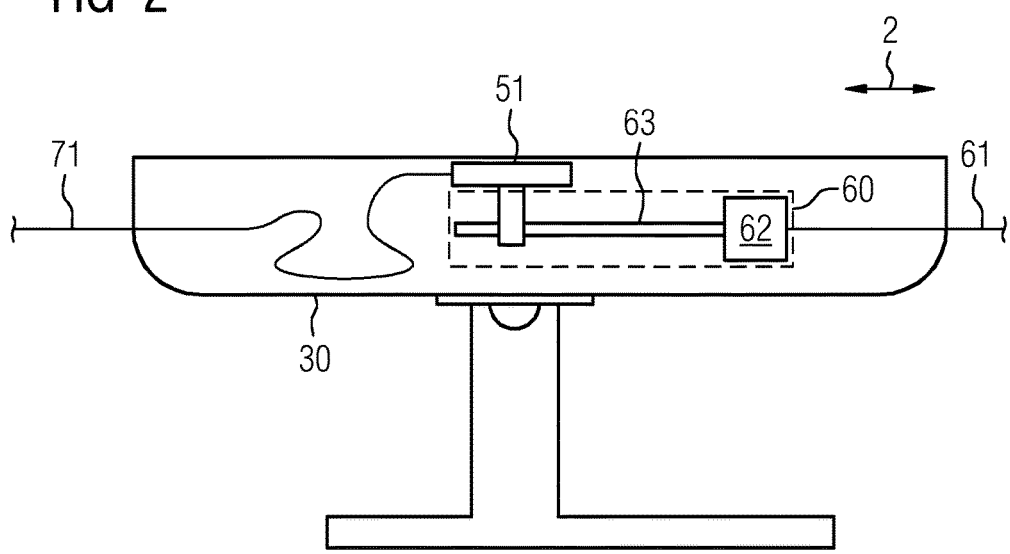
FIG. 2 shows part of an embodiment of a magnetic resonance tomography unit.

FIG. 2 shows a further embodiment of the magnetic resonance tomography unit 1, where only the examination table 30, which has fundamental elements of this embodiment, is illustrated.

Illustrated in the examination table 30 is a transmitting antenna 51 that is simultaneously the transmitting unit 50. The transmitting antenna 51 may be moved in the longitudinal direction 2 in the examination table 30 by the selector 60, which in FIG. 2, has a conveying unit with a drive 61. Thus, via the controlled position in the examination table 30, the transmitting antenna 51 may irradiate a high-frequency pulse into one of a plurality of different regions of the patient. The control unit 20 is capable of setting the position via the control connection 61.

In one embodiment, the drive 61 may be a step motor or an electric motor with a position sensor that moves the transmitting antenna 51 via a spindle 63. The spindle 63 may be made, for example, of a non-conducting and non-magnetic plastics material, and the drive 62 may be arranged outside of the examination region of the magnetic resonance tomography unit 1, so imaging is optimally not affected by magnetic fields or electric cables. For this reason, in one embodiment, the transmitting antenna 51 may be moved directly by compressed air or by a compressed air motor as the drive 62 of the spindle 63.

Figure 3:
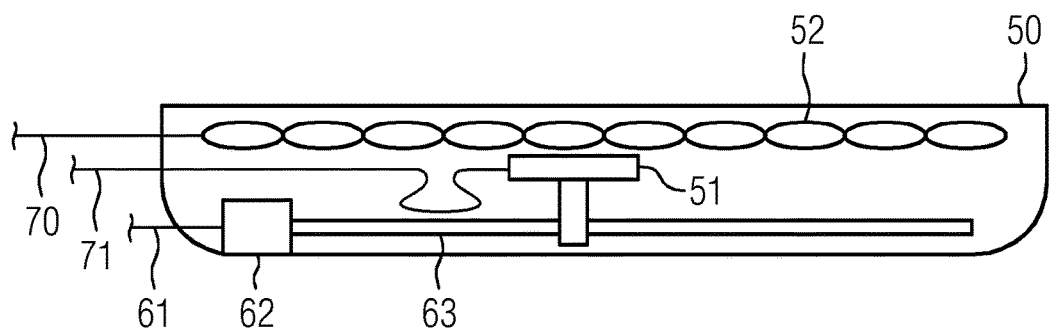
FIG. 3 shows a local coil of one embodiment of a magnetic resonance tomography unit.

FIG. 3 illustrates a further embodiment having the same basic principle as in FIG. 2. Same articles are provided with same reference numerals. A moving transmitting antenna 51 is arranged in a local coil 50 (e.g., in a spine coil). The drive 62 may then position the transmitting antenna inside the local coil 50 relative to a desired examination region of the patient 40. The matrix including receiving antennae 52 remains in a position.

Figure 4:
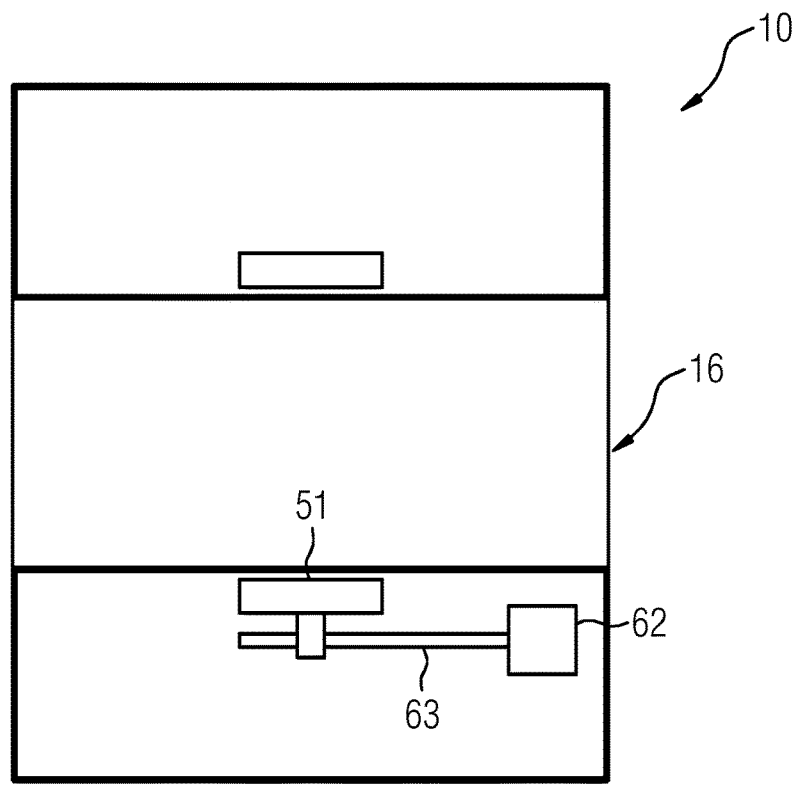
FIG. 4 shows part of an embodiment of a magnetic resonance tomography unit.

FIG. 4 shows a further embodiment. Same articles are provided with same reference numerals as in FIG. 1, although not all articles from FIG. 1 are shown. In this embodiment, the body coil 14 does not have a plurality of segments, and instead, a single segment of the body coil 14 may be moved as the transmitting antenna 51 by a drive 62 as the selector 60, which is provided in the magnetic unit 10 and moves the transmitting antenna 51 along the patient tunnel 16.

Figure 5:
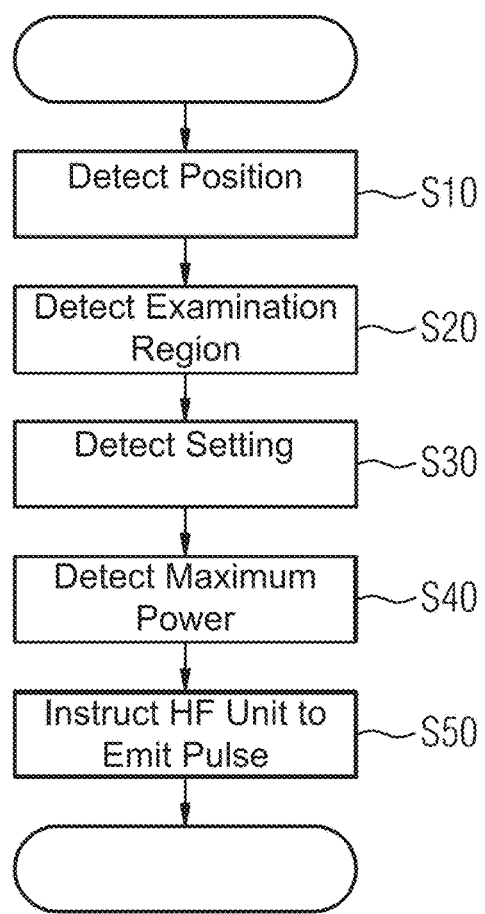
FIG. 5 shows a schematic flowchart of an embodiment of a method.

FIG. 5 shows a schematic flowchart of an embodiment of the method for operation of a magnetic resonance tomography unit 1.

In act S10 of the method, the control unit 20 detects a position of a patient 40 relative to the transmitting unit 50 using a position detector 80. For example, a camera in or on the magnetic unit 10 may serve as position detector 80. A detected image of the patient 40 in the patient tunnel 16 may be evaluated in the controller 23 by image recognition software, and the position of the patient 40 relative to the transmitting unit 50 may thus be determined, for example, if the transmitting unit 50 is provided in the examination table 30 or the magnetic unit 10. However, the magnetic resonance tomography unit 1 may itself be used as a position detector 80 by carrying out, for example, an overview scan. Other sensors, such as, for example, ultrasound or radar, may also be provided for position detection.

In act S20, the control unit 20 detects a region to be examined. For example, an input by an operator with information relating to the region to be examined may be received by the control unit 20 via a user interface. In one embodiment, the control unit 20 may receive a data set with the information relating to the examination region via a network connection from a different unit. In one embodiment, the region to be examined may be determined by the control unit 20 using an overview scan.

In act S30, the control unit 20 determines a setting of the selector 60 that is required for an excitation of spins in the region to be examined and effects a corresponding setting of the selector 60.

For example, with a magnetic resonance tomography unit 1 in FIG. 1, a recording in the lower region of the abdomen may be desired. It is then not necessary for spins to be excited in the thorax. Using the detected position of the patient 40, the control unit 20 then determines that only the segment of the body coil 14 on the left in FIG. 1 is required for excitation, and via the signal bus 25 in the selector 60 of the high-frequency unit 22 effects a setting that connects the output of the high-frequency amplifier of the high-frequency unit 22 only to the left segment of the body coil 14.

In the embodiments in FIG. 2 and FIG. 4, by contrast, the control unit 22 may instruct the selector 60 via the control connection 61 to move the transmitting antenna 51 to the left using the drive 62 and spindle 63.

In act S50, the controller 23 instructs the high-frequency unit 22 via the signal bus 25 to emit the excitation pulse for the spins in the desired examination region.

In one possible embodiment of the method, the method also has the act S40 of determining a maximum power as a function of the region to be examined and predetermined SAR limit values. As the region to be examined is known to the control unit 22, and the setting of the selector 60 and the high-frequency power to be emitted may be set by the control unit, the control unit may, for example, optimize the high-frequency power to a good SNR or a short examination time. Use is made here of the fact that the total amount of high-frequency power irradiated into a body is limited according to guidelines, where a higher power density may be used with only partial irradiation since the generated heat is distributed and dissipated by the circulation. The control unit 20 may therefore determine, in the framework of the limit values, the maximum admissible power for the region to be examined and instruct the high-frequency unit 22 via the signal bus 25 to generate corresponding excitation pulses. Appropriate setting of the selector 60 provides that the power is only irradiated into the region to be examined.

Figure 6:
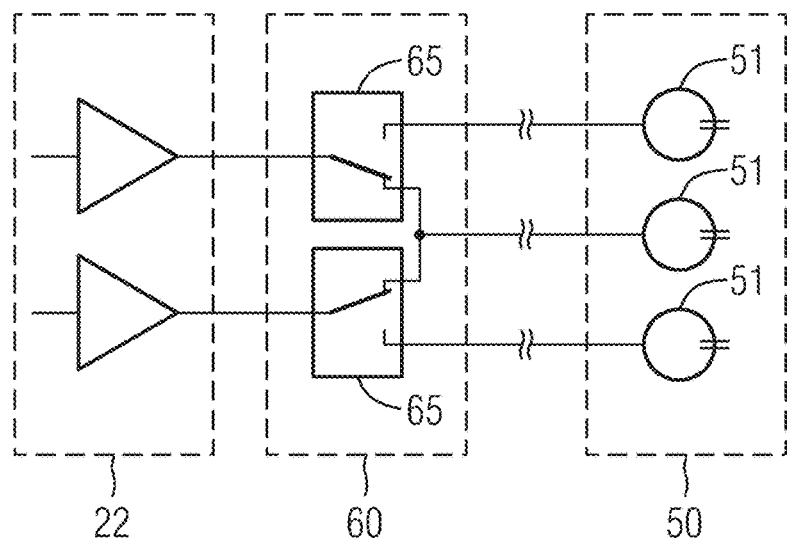
FIG. 6 shows part of an embodiment of a magnetic resonance tomography unit having a switching matrix.

FIG. 6 illustrates a detail of an embodiment of a magnetic resonance tomography unit 1 in which a switching matrix is used as the selector 60.

Two high-frequency power amplifiers, for example, are provided in the high-frequency unit 22 in FIG. 6, and these each output a high-frequency signal. The high-frequency signal is fed to the selector 60, in which two high-frequency switches 65 are provided. In this illustrated embodiment, the signal outputs of the two high-frequency power amplifiers are flexibly connected to the three illustrated transmitting antennae 51 of the transmitting unit 50 by the two switches 25. Depending on the position of the switches 65, the signals of the two high-frequency power amplifiers may be distributed among two transmitting antennae 51. In one embodiment, the transmitting power of the two high-frequency power amplifiers may be concentrated on a single transmitting antenna 51. The high-frequency signals of the two high-frequency power amplifiers may be adjusted appropriately in phase and impedance so the signals add up.

The switches 65 may be configured, for example, as coaxial relays, although switching matrices having active semiconductor elements may also be provided (e.g., having PIN diodes and associated phase shifter elements, comparable to a Butler matrix).

Although the invention has been illustrated and described in more detail by the exemplary embodiments, the invention is not limited by the disclosed examples. A person skilled in the art may derive other variations herefrom without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography unit comprising:
a controller;
a transmitter comprising a plurality of transmitting antennae;
a selector including a switching matrix and a positioning device configured to position the plurality of transmitting antennae in predetermined different relative positions to a patient; and
a high-frequency unit having a signal output in signal connection with the transmitter,
wherein the magnetic resonance tomography unit is configured to irradiate high-frequency energy into only a first region of a plurality of different regions in the patient using the selector and the plurality of transmitting antennae,
wherein the switching matrix is configured to bring a signal output of the high-frequency unit into signal connection with a non-empty subset of multiple transmitting antennae of the plurality of transmitting antennae.

2. The magnetic resonance tomography unit of claim 1, wherein the controller is configured to set the switching matrix as a function of a region of the patient to be examined such that the first region of the patient essentially comprises only the region to be examined.

3. The magnetic resonance tomography unit of claim 2, wherein the controller is configured to maximize a transmitting power of the high-frequency unit as a function of the first region.

4. The magnetic resonance tomography unit of claim 1, wherein the controller is configured to maximize a transmitting power of the high-frequency unit as a function of the first region.

5. The magnetic resonance tomography unit of claim 1, wherein the controller is configured to maximize a transmitting power of the high-frequency unit as a function of a first region of the patient.

6. A method for operating a magnetic resonance tomography unit, wherein the magnetic resonance tomography unit comprises a controller, a transmitter, a selector including a switching matrix, and a high-frequency unit having a signal output in signal connection with the transmitter, the transmitter having plurality of transmitting antennae, the method comprising:
detecting, by the controller using a position detector, a position of a patient relative to the transmitter;
detecting, by the controller, a first region of a plurality of different regions in the patient to be examined;
determining and implementing, by the controller, a setting of the selector that is required for excitation of spins in only the first region to be examined by the plurality of transmitting antennae;
bringing, by the switching matrix, a signal output of the high-frequency unit into signal connection with a non-empty subset of multiple transmitting antennae of the plurality of transmitting antennae; and emitting, by the high-frequency unit and the transmitter, a high-frequency pulse for excitation of the spins in only the first region to be examined.

7. The method of claim 6, further comprising:
determining and adjusting a maximum power as a function of the first region to be examined and predetermined SAR limit values.

8. A non-transitory computer-readable storage medium storing instructions executable by a controller of a magnetic resonance tomography unit to operate the magnetic resonance tomography unit, wherein the magnetic resonance tomography unit comprises a controller, a transmitter, a selector including a switching matrix, and a high-frequency unit having a signal output in signal connection with the transmitter, the transmitter having plurality of transmitting antennae, the instructions comprising:
detecting, by the controller using a position detector, a position of a patient relative to the transmitter;
detecting, by the controller, a first region of a plurality of different regions in the patient to be examined;
determining and implementing, by the controller, a setting of the selector that is required for excitation of spins in only the first region to be examined by the plurality transmitting antennae;
bringing, by the switching matrix, a signal output of the high-frequency unit into signal connection with a non-empty subset of multiple transmitting antennae of the plurality of transmitting antennae; and
emitting, by the high-frequency unit and the transmitter, a high-frequency pulse for excitation of the spins in only the first region to be examined.

9. The non-transitory computer-readable storage medium of claim 8, wherein the instructions further comprise:
determining and adjusting a maximum power as a function of the region to be examined and predetermined SAR limit values.

* * * * *